(12) United States Patent
Saito

(10) Patent No.: US 7,278,564 B2
(45) Date of Patent: Oct. 9, 2007

(54) METHOD OF MOUNTING ELECTRONIC COMPONENT, STRUCTURE FOR MOUNTING ELECTRONIC COMPONENT, ELECTRONIC COMPONENT MODULE, AND ELECTRONIC APPARATUS

(75) Inventor: Atsushi Saito, Chino (JP)

(73) Assignee: Seiko Epson Corporation, Tokyo (JP)

( * ) Notice: Subject to any disclaimer, the term of this patent is extended or adjusted under 35 U.S.C. 154(b) by 360 days.

(21) Appl. No.: 10/839,283

(22) Filed: May 6, 2004

(65) Prior Publication Data

US 2004/0238603 A1    Dec. 2, 2004

(30) Foreign Application Priority Data

May 27, 2003    (JP)    ............... 2003-149227

(51) Int. Cl.
   *B23K 31/00*    (2006.01)
   *B23K 31/02*    (2006.01)
(52) U.S. Cl. ............... 228/248.1; 228/122.1; 228/123.1
(58) Field of Classification Search ............ 228/248.1, 228/122.1, 123.1
   See application file for complete search history.

(56) References Cited

U.S. PATENT DOCUMENTS

| 5,401,913 A |   | 3/1995 | Gerber et al. |
|---|---|---|---|
| 5,872,051 A | * | 2/1999 | Fallon et al. ............... 438/616 |
| 6,051,093 A | * | 4/2000 | Tsukahara ............... 156/251 |
| 6,522,017 B2 |   | 2/2003 | Horiuchi et al. |
| 6,531,022 B1 |   | 3/2003 | Tsukahara |
| 6,551,854 B2 | * | 4/2003 | Hosomi et al. ............ 438/106 |
| 2001/0027007 A1 | * | 10/2001 | Hosomi et al. ............ 438/611 |
| 2002/0056906 A1 | * | 5/2002 | Kajiwara et al. ........... 257/697 |

FOREIGN PATENT DOCUMENTS

| CN | 1125998 A | 7/1996 |
|---|---|---|
| CN | 1195422 A | 10/1998 |
| JP | A 58-021350 | 2/1983 |
| JP | A 2001-257453 | 9/2001 |
| JP | A-2003-124259 | 4/2003 |
| JP | A-2003-324126 | 11/2003 |
| WO | WO97/16848 | 5/1997 |

* cited by examiner

*Primary Examiner*—Jonathan Johnson
*Assistant Examiner*—Rachel E. Beveridge
(74) *Attorney, Agent, or Firm*—Oliff & Berridge PLC

(57)    ABSTRACT

The invention provides a method of mounting an electronic component where an electronic component can be reliably electrically-connected to a substrate. A substrate defines a through-hole that extends through the substrate, from connection electrodes formed on the lower surface of the substrate, to the upper surface of the substrate. A low melting point metal is connected to the connection electrodes and fills the through-hole. A bump and the low melting point metal are alloyed and bonded by heating the low melting point metal while pressing the bump formed on an electrode pad of an electronic component, with respect to a front end of the low melting point metal. The active surface of the electronic component is sealed by the upper surface of the substrate.

3 Claims, 6 Drawing Sheets

METHOD OF MOUNTING ELECTRONIC COMPONENT, STRUCTURE FOR MOUNTING ELECTRONIC COMPONENT, ELECTRONIC COMPONENT MODULE, AND ELECTRONIC APPARATUS

BACKGROUND OF THE INVENTION

1. Field of Invention

The present invention relates to a method of mounting an electronic component, a structure to mount an electronic component, an electronic component module, and an electronic apparatus.

2. Description of Related Art

An electronic component, such as an integrated circuit IC, can be used after being mounted on a circuit board. The related art includes various methods of mounting the electronic component on the circuit board. FIGS. 7(a) and 7(b) show a structure to mount an electronic component according to the related art. In FIG. 7(a), the electronic component 170, such as an IC, is mounted on the substrate 120 with an anisotropic conductive film (ACF) 190 sandwiched in between them. The anisotropic conductive film 190 disperses conductive particles 195 in a thermosetting resin 192. The conductive particles 195 are inserted between electrode pads 172 formed on an active surface of the electronic component 170 and electronic pads 122 formed on the surface of the substrate 120 to electrically connect the pads to each other. In addition, the electronic component 170 and the substrate 120 are mechanically connected to each other by the thermosetting resin 192 cured by heat treatment and the electrical connection between the electronic component 170 and the substrate 120 is protected.

As electronic components have become miniaturized, the clearances of the electrodes have become smaller. However, in the mounting method using the anisotropic conductive film, the clearances of the electrode pads have become so narrow that shorts are generated between the electronic pads, because the conductive particles 195 are disposed between horizontally adjacent electrode pads. In addition, since the clearances of the electronic pads have narrowed and the electrode pad itself is so small, the number of the conductive particles captured by each electrode pad has decreased, and the reliability of the electrical connection has deteriorated. Further, all of the expensive conductive particles cannot be used for the electrical connection.

Accordingly, International Publication WO 97/16848 pamphlet discloses a method of melting a base material composed of thermoplastic resin to adhere it to an active surface of the electronic component. FIG. 7(b) shows the mounted structure disclosed in International Publication WO 97/16848 pamphlet. In this mounted structure, a solder bump 274 is formed on an electronic component 270, such as an IC. In addition, a connection pattern 222 is formed on the bottom surface of the base material 220 composed of thermoplastic resin. Further, the electronic component 270 of the substrate 220 which has been heated at a temperature equal to or higher than the melting temperature is pressed onto the upper surface of the base material 220, the solder bump 274 passes through the base material 220 to contact the connection pattern 222. As a result, the electronic component 270 is electrically connected with the base material 220. In addition, the electronic component 270 is adhered and mechanically connected to the base material 220 solidified after melting it and the area around the solder bump 274 is protected.

SUMMARY OF THE INVENTION

However, in the mounting method of International Publication WO 97/16848 pamphlet, since the solder bump 274 passes through the base material 220 to contact the connection pattern 222, thermoplastic resin constituting the base material 220 may remain between the solder bump 274 and the connection pattern 222.

In addition, since the thermoplastic resin has an insulating property, current cannot flow between the solder bump 274 and the connection pattern 222, and it is impossible to electrically connect the electronic component 270 to the base material 220.

In addition, in the mounting method of International Publication WO 97/16848 pamphlet, since the bump 274 of the electronic component 270 is formed with soldering, narrow electrode clearances cannot be accomplished. In detail, by the limits of the bump manufacturing process, the solder bump 274 cannot be formed with clearances of 100 μm or less. Further, since flux cannot be applied to the connection pattern 222 contacting the solder bump 274, it is impossible to ensure the electrical connection between the solder bump 274 and the connection pattern 222.

Accordingly, the present invention addresses or solves the above, and provides a method of mounting the electronic component and a structure to mount the electronic component, which can reliably ensure the electrical connection between the electronic component and the substrate.

In addition, the present invention provides an electronic component module and an electronic apparatus, in which the electrical connections between the electronic components and the substrate can be reliably ensured.

In order to address or solve the above, a method of mounting an electronic component on a substrate according to the present invention is provided such that the substrate defines holes that extend through the substrate from a conductor formed on one surface of the substrate to the other surface of the substrate. A low melting point metal is electrically connected to the conductor and fills the holes. Bumps and the low melting point metal are alloyed and bonded by heating the low melting point metal while pressing the bumps formed on the electronic component from the other surface of the substrate with respect to the holes filled with the low melting point metal.

According to this configuration, since the bump need not pass through the substrate, the insulating material constituting the substrate is not attached to the front end of the bump. Accordingly, the electrical connection between the electronic component and the substrate can be reliably ensured. Further, the bump can be formed by material other than the solder and a narrow electrode clearance can be accomplished. In addition, it is possible to alloy and bond the bump and the low melting point metal at a relatively low temperature. Accordingly, damage to the electronic component from the heating can be reduced.

In addition, it is preferable that a plurality of the holes filled with the low melting point metal be arranged in the substrate with a predetermined gap therebetween, the bumps and the low melting point metal be alloyed and bonded by heating the electronic component to heat the low melting point metal while inserting the bumps into the holes from the other surface of the substrate by pressing the bumps, the substrate be heated and plasticized by heating the electronic component while pressing the active surface of the electronic component having the bumps formed thereon to the other opposite surface of the substrate, which is composed of thermoplastic resin, and the active surface of the electronic component be sealed by the other surface of the substrate.

According to this configuration, the electrical connection and the mechanical connection between the electronic component and the substrate can be efficiently performed in one process. In addition, since the electrical connection between the electronic component and the substrate can be protected without using anisotropic conductive film, the short generated between the electrodes due to the narrow clearances of the electrodes can be reduced or prevented.

In addition, it is preferable that the bumps be composed of copper, and the low melting point metal form Cu—Sn alloy in the bumps and the low melting point metal junction, in Sn or Sn alloy. According to this configuration, the bump can be alloyed and bonded to the low melting point metal at a relatively low temperature of 250 to 300° C., and the damage to the electronic component due to heating can be reduced.

In addition, another method of mounting an electronic component on a substrate according to the present invention is provided such that the substrate defines holes that extend through the substrate from a conductor formed on one surface of the substrate to the other surface of the substrate. A non-cured thermosetting resin having conductivity is electrically connected to the conductor and fills the holes. Bumps and the thermosetting resin are alloyed and bonded by heating the thermosetting resin while pressing the bumps formed on the electronic component from the other surface of the substrate with respect to the holes filled with the thermosetting resin.

According to this configuration, the electrical connection between the electronic component and the substrate can be reliably ensured. Further, the narrow electrode clearances can be accomplished. In addition, it is possible to adhere the bump and the low melting point metal at a relatively low temperature by heating and curing the non-cured thermosetting resin. Accordingly, the damage to the electronic component due to the heating can be reduced.

In addition, it is preferable that a plurality of the holes filled with the thermosetting resin be arranged in the substrate with a predetermined gap therebetween, the thermosetting resin be heated and cured by heating the electronic component while burying the bumps by inserting the bumps into the holes from the other surface of the substrate, and the bumps be adhered to the thermosetting resin, the substrate be heated and plasticized by heating the electronic component while pressing the active surface of the electronic component having the bumps formed thereon to the other opposite surface of the substrate, which is composed of the thermoplastic resin, and the active surface of the electronic component be sealed by the other surface of the substrate.

According to this configuration, the electrical connection and the mechanical connection between the electronic component and the substrate can be efficiently performed in one process. In addition, any shorts generated between the electrodes due to the narrow clearances of the electrodes can be reduced or prevented.

Further, it is preferable that the size of the open shape of the holes be greater than that of the planar shape of the bumps. By this configuration, since the bump can be simply inserted into the hole, the manufacturing process thereof can be simplified.

In addition, it is preferable that the holes be formed by irradiating laser light from the other surface of the substrate to the conductor formed on one surface of the substrate. By this configuration, the hole can be formed from the inside of the conductor to the other surface of the substrate, without damaging the conductor formed on one surface of the substrate.

On the other hand, a structure to mount an electronic component according to the present invention is formed using any one of the above-mentioned methods of mounting an electronic component. By this configuration, the structure to mount the electronic component having the above-mentioned effect can be provided.

In addition, another structure to mount an electronic component on a substrate according to the present invention is provided such that the substrate defines holes that extend through the substrate from a conductor formed on one surface of the substrate to the other surface of the substrate. A low melting point metal is electrically connected to the conductor and fills the holes. Bumps and the low melting point metal filling the holes are alloyed and bonded.

According to this configuration, since the bump need not pass through the substrate, the insulating material constituting the substrate is not attached to the front end of the bump. Accordingly, the electrical connection between the electronic component and the substrate can be reliably ensured. Further, the bump can be formed by material other than the solder and the narrow clearances of the electrodes can be accomplished. In addition, it is possible to alloy and bond the bump and the low melting point metal at a relatively low temperature. Accordingly, the damage to the electronic component due to the heating can be reduced.

In addition, it is preferable that a plurality of the holes filled with the thermosetting resin be arranged in the substrate with a predetermined gap and be alloyed and bonded to the bumps, and the active surface of the electronic component having the bumps formed thereon be sealed by the other surface of the substrate composed of thermoplastic resin.

According to this configuration, the electrical connection and the mechanical connection between the electronic component and the substrate can be efficiently performed in one process. In addition, since the electrical connections between the electronic component and the substrate can be protected without using anisotropic conductive film, any shorts generated between the electrodes due to the narrow clearances of the electrodes can be reduced or prevented.

In addition, it is preferable that the bumps be composed of copper, the low melting point metal form Cu—Sn alloy in the bumps and the low melting point metal junction, in Sn or Sn alloy. According to this configuration, the bump can be alloyed and bonded to the low melting point metal at a relatively low temperature of 250 to 300° C., the damage to the electronic component due to the heating can be reduced.

Further, another structure for mounting an electronic component on a substrate according to the present invention is provided such that the substrate defines holes that extend through the substrate from a conductor formed on one surface of the substrate to the other surface of the substrate. A non-cured thermosetting resin having conductivity is electrically connected to the conductor and fills the holes. Bumps formed on the electronic component from the other surface of the substrate are adhered to the holes filled with thermosetting resin.

According to this configuration, the electrical connection between the electronic component and the substrate can be reliably ensured. Further, the narrow clearances of the electrodes can be accomplished. In addition, it is possible to adhere the bump at a relatively low temperature by heating and curing the non-cured thermosetting resin. Accordingly, the damage of the electronic component due to the heating can be reduced.

In addition, it is preferable that a plurality of the holes filled with the thermosetting resin be arranged in the substrate with a predetermined gap therebetween and be adhered to the bumps, the active surface of the electronic component having the bumps formed thereon be sealed by the other surface of the substrate composed of thermoplastic resin.

According to this configuration, the electrical connection and the mechanical connection between the electronic component and the substrate can be efficiently performed in one process. In addition, any shorts generated between the electrodes due to the narrow clearances of the electrodes can be reduced or prevented.

On the other hand, an electronic component module according to the present invention includes any one of the above-mentioned structures of mounting the electronic component. By this configuration, the electronic component module having the above-mentioned effect can be provided.

On the other hand, an electronic apparatus according to the present invention includes the above-mentioned electronic component module. By this configuration, the electronic apparatus having the above-mentioned effect can be provided.

DETAILED DESCRIPTION OF PREFERRED EMBODIMENTS

Exemplary embodiments of the present invention are explained below with reference to the accompanying drawings. In addition, in drawings used in the below description, the scale of each member is appropriately changed in order to recognize the size of each member.

First Exemplary Embodiment

Figure 2:
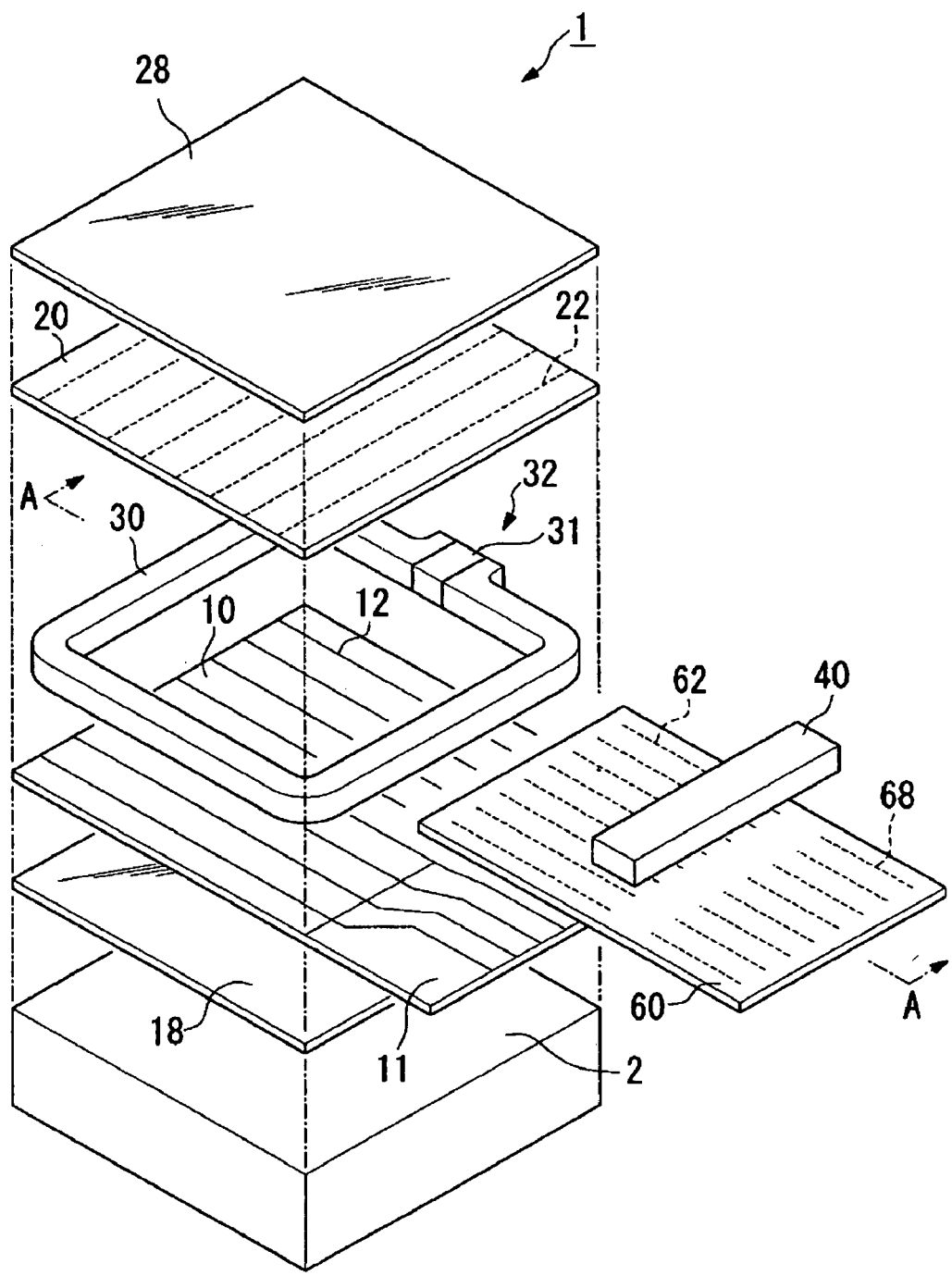
FIG. 2 is an exploded perspective view of a liquid crystal display device.
Figure 3:
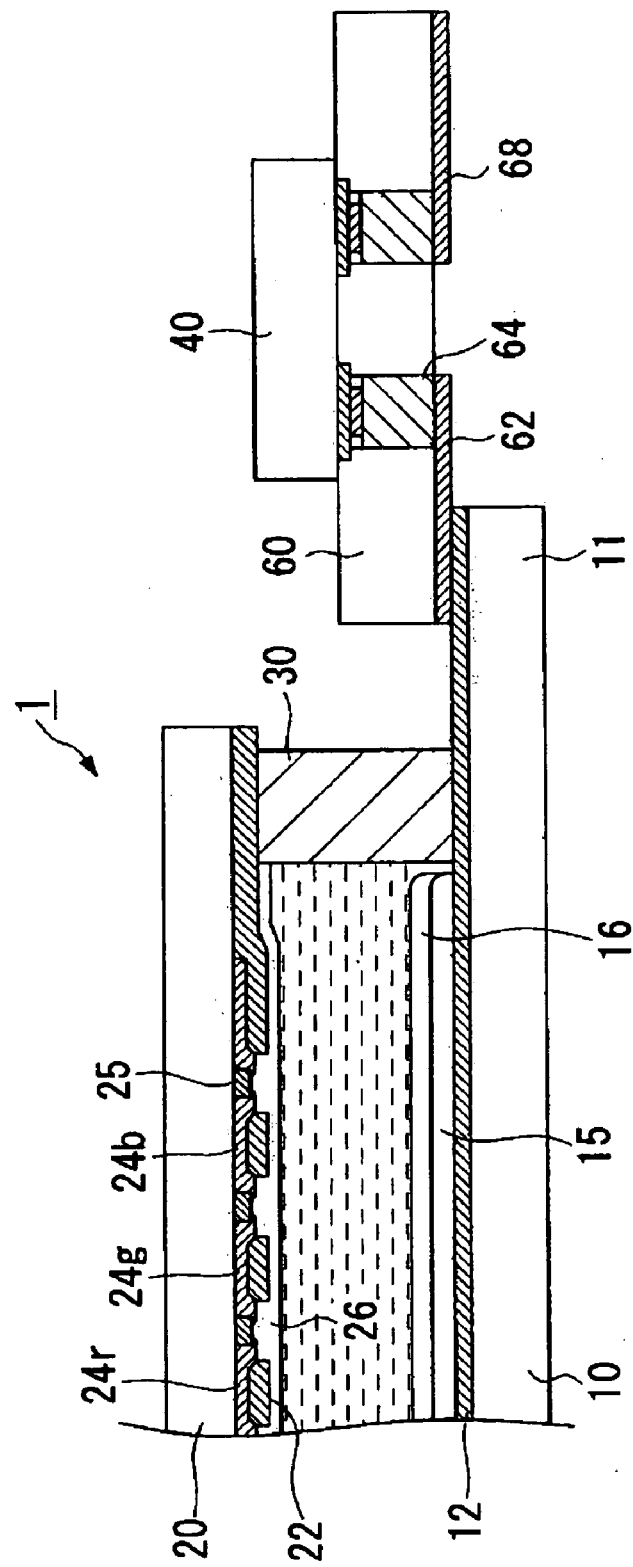
FIG. 3 is a cross-sectional side view taken along plane A-A of FIG. 2.

First, the structure and method of mounting an electronic component according to the first exemplary embodiment is described. A liquid crystal display device, which is the electronic component module mounted with an IC as the electronic component, is explained with reference to FIGS. 2 and 3. In addition, FIG. 2 is an exploded perspective view of the liquid crystal display device, and FIG. 3 is a cross-sectional side view taken along plane A-A of FIG. 2. In addition, although in the present exemplary embodiment, a passive matrix type liquid crystal display device is explained as an example, the present invention can be applied to an active matrix type liquid crystal display device. Further, FIGS. 2 and 3 schematically show the liquid crystal display device, but an actual liquid crystal display device is formed of a plurality of various electrodes and terminals.

Exemplary Liquid Crystal Display Device

As shown in FIG. 2, in the liquid crystal display device 1 according to the present exemplary embodiment, a pair of lower substrate 10 and upper substrate 20 composed of transparent material, such as glass, is positioned opposite each other. The gap between the substrates 10 and 20 is defined by the diameter of bead-shaped spacer (not shown) positioned between them and is for example about 5 µm. In addition, the circumferences of the substrates 10 and 20 are adhered to each other by sealing material 30 composed of an adhesive, such as a thermal or ultraviolet curable adhesive. The portion of the sealing material 30 is provided with a liquid crystal injection hole 32 protruding from the substrates 10 and 20 to outside thereof. In addition, after liquid crystal is injected into the space surrounded by the substrates 10 and 20 and the sealing material 30 through the liquid crystal injecting hole 32, the liquid crystal injecting hole 32 is sealed with sealing material 31.

In addition, an incident side polarizer 18 is provided to the lower side of the lower substrate 10 and an emitting side polarizer 28 is provided to the upper side of the upper substrate 20. Further, the incident side polarizer 18 and the emitting side polarizer 28 are arranged so that the polarization axes (transmission axes) are perpendicular to each other. In addition, a back light device 2 is provided to the lower surface of the incident side polarizer 18. When light from the back light device 2 is incident to the incident side polarizer 18, only linearly polarized light along the polarization axis of the incident side polarizer 18 is transmitted through the incident side polarizer 18. The linearly polarized light transmitting through the incident side polarizer 18 is rotated according to the oriented state of the liquid crystal molecule in process of transmitting through the liquid crystal layer sandwiched between the substrates 10 and 20. Further, the linearly polarized light transmitted through the liquid crystal layer transmits through the emitting side polarizer 28 only when the polarization axis is aligned to that of the emitting side polarizer 28. Thereby, the picture is formed by the linearly polarized light transmitting through the emitting side polarizer 28.

On the other hand, scanning electrodes 22 composed of a transparent conductive material such as ITO are formed on the inner surface of the upper substrate 20 with a stripe shape. In addition, signal electrodes 12 composed of a transparent conductive material such as ITO are formed on the inner surface the lower substrate 10 with a striped shape. In addition, the scanning electrodes 22 and the signal electrodes 12 are arranged to be perpendicular to each other, and the cross portion thereof becomes the pixel area of the liquid crystal display device. When a scanning signal is supplied to one scanning electrode 22 and a data signal is supplied to the signal electrode 12, the liquid crystal layer sandwiched between both the electrodes 12 and 22 is applied with a voltage, in the cross point of the electrodes 12 and 22. Herein, the oriented state of the liquid crystal molecules is controlled by the applied voltage level. Thereby, the rotated angle of the linearly polarized light incident into the liquid crystal layer is controlled, thereby forming the picture display by the liquid crystal display device 1.

FIG. 3 is a cross-sectional side view taken along plane A-A of FIG. 2. Color filter layers 24r, 24g, 24b of red (R), green (G) and blue (B) color are formed in each pixel area in the upper substrate 20. Thereby, it is possible to display the color picture by the liquid crystal display device 1. In addition, a light shielding film 25 is formed between the color filter layers 24r, 24g, 24b, thereby reducing or preventing leaking light from the adjacent pixel areas. In addition, the scanning electrodes 22 are formed on the surface of each of the color filter layers 24r, 24g, 24b, and an orientation film 26 is formed on the surface of the scanning electrode 22.

On the other hand, a signal electrode 12 is formed on the upper surface of the lower substrate 10. In addition, an overcoat film 15 is formed on the surface of the signal electrode 12, and an orientation film 16 of liquid crystal molecule is formed on the surface of the overcoat film 15. By the orientation film 16, the oriented state of the liquid crystal molecule is defined in case that the voltage is not applied. In addition, the orientation films 16, 26 are formed such that the oriented direction of the liquid crystal molecules according to the orientation film 26 of the upper substrate 20 is perpendicular to that of the orientation film 16 of the lower substrate 10.

Herein, the lower substrate 10 is formed with protrusions toward the upper substrate 20, and, on protrusion 11, each signal electrode 12 is extended and formed. On the front end of the protrusion 11, one end of the flexible printed circuit (hereinafter, referred to as FPC) 60 is mounted through an anisotropic conductive film (not shown). In addition, a conductive connection electrode 62 is formed on the lower surface of one end of the FPC 60 corresponding to each signal electrode 12 of the lower substrate 10. In addition, by inserting the anisotropic conductive film, the connecting electrode 62 of the FPC 60 is electrically connected to each signal electrode 12 of the lower substrate 10.

On the other hand, in order to connect the FPC 60 to the other circuit board, a conductive connection electrode 68 is formed on the lower surface of the other end of the FPC 60. In addition, these connection electrodes 62 and 68 are turned around the upper surface of the FPC 60 by the through-hole electrode passing through the inside and outside of the FPC 60. Further, a driver IC 40 is mounted on the upper surface of the FPC 60. By the driver IC 40, each signal electrode 12 is driven in correspondence with the signal from the above-mentioned other circuit board.

Exemplary Structure to Mount the Driver IC

Figure 1:
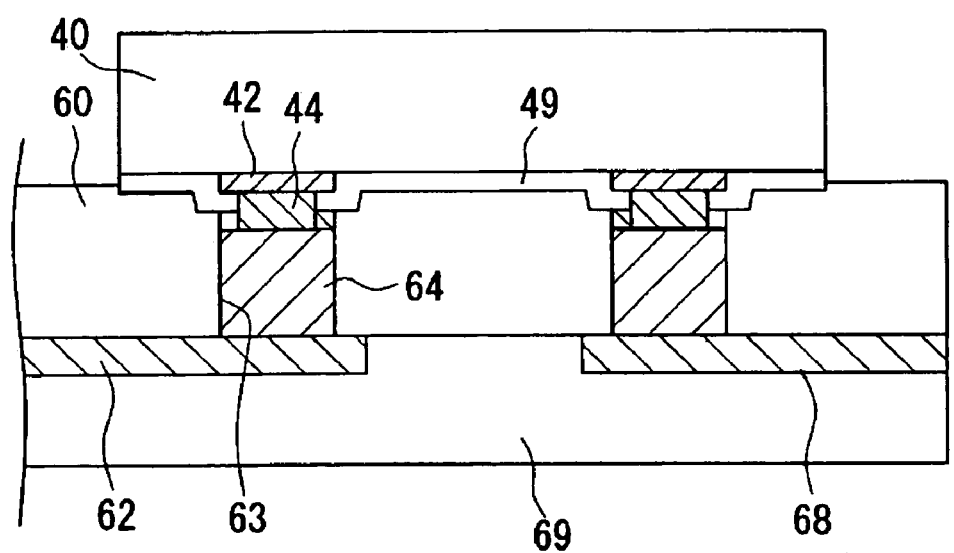
FIG. 1 is a schematic that illustrates a structure to mount an electronic component according to a first exemplary embodiment.

FIG. 1 illustrates the mounted structure of the driver IC 40 according to the exemplary embodiment of the electronic component according to the present invention, and is a partial enlarged view of FIG. 3. On the active surface (lower surface) of the driver IC (hereinafter IC) 40, a plurality of electrode pads 42 composed of conductive material, such as A1, are formed with a predetermined pitch. In addition, on the surface of each electrode pad 42, a bump 44 is formed with copper (Cu) plating. For example, each bump 44 is formed with a width of 30 μm or less and an adjacent bump 44 is disposed with a gap of about 10 μm. As a result, the pitch of each bump is about 40 μm. Further, on the active surface of the IC 40 except for the portion of forming the bump 44, a passivation film 49 composed of silicon dioxide (SiO$_2$) or silicon nitride (Si$_3$N$_4$) is formed.

On the other hand, the FPC 60 having a thickness of, for example, about 25 μm is formed by thermoplastic resin such as polyester resin, polyamid resin, aromatic polyester resin, and aromatic polyamid resin so that it is applied with plasticity. On the lower surface of the FPC 60, connection electrodes 62 and 68 composed of Cu are formed with a thickness of, for example, about 9 μm. In addition, in order to protect the connection electrodes 62 and 68, a protection film 69 including liquid crystal polymer or resist is formed over the entire lower surface of the FPC 60.

In addition, a through-hole 63 is formed from the connection electrodes 62 and 68, formed on the lower surface of the FPC 60, to the upper surface of the FPC 60. The diameter of the through-hole 63 is, for example, about 30 μm or more. In addition, the open shape of the through-hole 63 may be circular or rectangular. Further, the size of the open shape of the through-hole 63 is formed to be greater than that of the planar shape of the bump 44 in the IC 40. As a result, the bump 44 may be simply inserted into the through-hole 63.

Further, the through-hole 63 is filled with low melting point metal 64. The low melting point metal 64 is metal, such as stannum (Sn), indium (In) and zinc (Zn) or the alloy of those metals. In addition, the one end of the low melting point metal 64 is connected to the connection electrodes 62 and 68. In addition, the other end of the low melting point metal 64 is arranged in the FPC 60 with a predetermined gap from the upper surface of the FPC 60. The predetermined gap is equal to or less than the height from the active surface of the IC 40 to the front end of the bump 44.

In addition, the front end of the bump 44 in the IC 40 is alloyed and bonded with respect to the other end of the low melting point metal 64 in the FPC 60. In detail, the composition of the low melting point metal 64 and the bump 44 spreads to each other to form an alloy thereof, thereby bonding the bump to the low melting point metal. Further, the front end of the bump 44 may be buried in the low melting point metal 64. On the other hand, the active surface of the IC 40 is attached to the upper surface of the FPC 60 composed of thermoplastic resin and is sealed.

Exemplary Method of Mounting the Driver IC

Figure 4A:
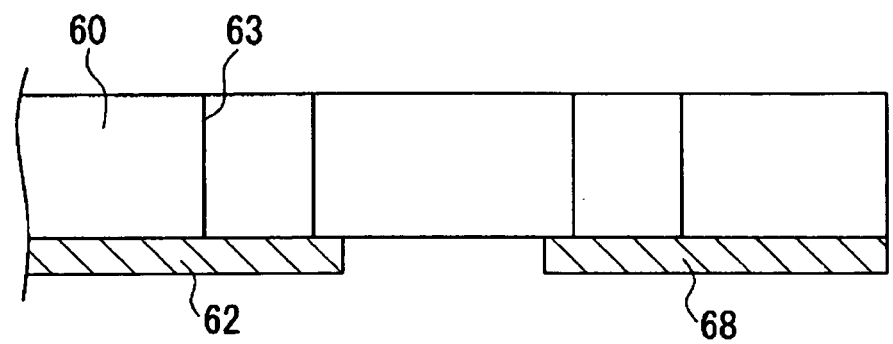
FIGS. 4a-4c are schematics that illustrate a method of mounting an electronic component according to the first exemplary embodiment.
Figure 4B:
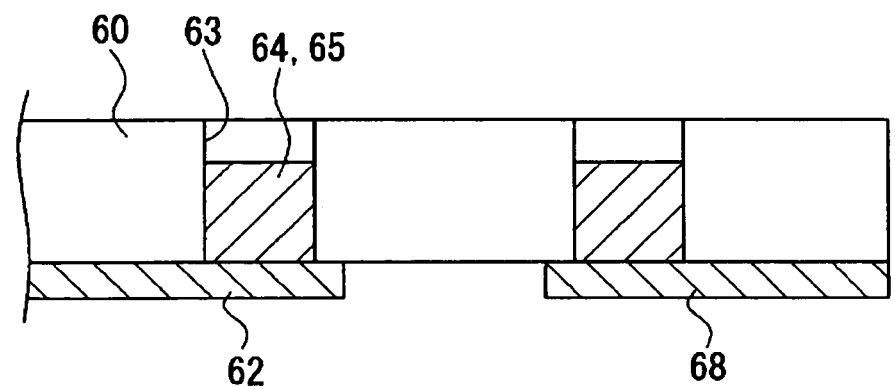
Figure 4C:
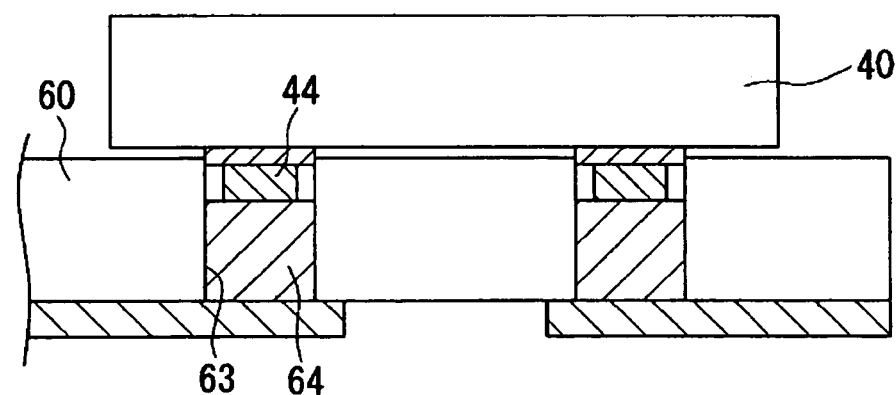

Next, a method of mounting the driver IC is explained with reference to FIGS. 4a-4c. FIGS. 4a-4c illustrate the method of mounting the IC. In addition, in FIGS. 4a-4c, the protective film 69 and the passivation film 49 (see FIG. 1) are omitted.

First, as shown in FIG. 4a, the through-hole 63 is formed in the FPC 60. The through-hole 63 is formed by irradiating laser light from the upper surface of the FPC 60 and removing thermoplastic resin constituting the FPC 60. In addition, by moving the focus of the laser, the through-hole 63 is formed from the upper surface of the FPC 60 to the lower surface of the connection electrode 62. Like this, by using the laser, the through-hole 63 can be formed, without damaging the connection electrodes 62 and 68 formed on the lower surface of the FPC 60.

Next, as shown in FIG. 4b, the low melting point metal 64 fills in the through-hole 63. In detail, the low melting point metal having a paste shape fills in the through-hole 63 using a printing method. In addition, instead of a printing method, sputter or plating can be used. In addition, the low melting point metal 64 fills the hole such that the lower end thereof is connected to the connection electrodes 62 and 68. In addition, the low melting point metal 64 fills the hole such that the upper end thereof is disposed from the surface of the FPC 60 to the inside of the FPC 60 with a predetermined gap. The predetermined gap is equal to or less than the height from the active surface of the IC 40 to the front end of the bump 40.

Next, as shown in FIG. 4c, the heated IC 40 is disposed on the upper side of the FPC 60 to insert the front end of the bump 44 in the IC 40 into the through-hole 63 in the FPC 60. In addition, the front end of the bump 44 is pressed to the upper end of the low melting point metal 64. Herein, since the upper end of the low melting point metal 64 is disposed with a predetermined gap from the upper surface of the FPC 60, the front end of the bump 44 contacts with the front end of the low melting point metal 64 before the active surface of the IC 40 contacts with the upper surface of the FPC 60. In addition, as mentioned below, since the bump 44 is adhered to the low melting point metal, the electrical connection between the IC 40 and the FPC 60 can be reliably ensured.

In addition, the heating process of the above-mentioned IC 40 works in such a way that the front end of the low melting point metal 64 contacting with the bump 44 is heated at a temperature of 200° C. or more. Like this, if the low melting point metal 64 is heated through the IC 40, only the front end of the low melting point metal 64 required for alloy and bond can be efficiently heated. On the other hand, the IC 40 on the FPC 60 is pressed such that a force of 98 N (10 gf) or more is applied to each electrode pad. Here, since the melting point of Sn is about 230° C., CuSn alloy of Cu of the composition of the bump 44 and Sn of the composition of the low melting point metal 64 can be formed by performing the heating process at a temperature of 250 to 300° C. or more with the press. The alloy is formed in the contact portion between the bump 44 and the low melting point metal 64 by spreading the composition of the bump 44 and the composition of the low melting point metal 64 to each other. Thereby, the bump 44 and the low melting point metal 64 is alloyed and bonded.

In addition, since the front end of the low melting point metal 64 is heated at a temperature near the melting point of the Sn, the front end of the bump 44 enters into the inside of the low melting point metal 64. As a result, the active surface of the IC 40 contacts with the upper surface of the FPC 60. In addition, similar to the front end of the low melting point metal 64, the upper surface of the FPC 60 is also heated at a temperature of 200° C. or more. Since aromatic polyester resin constituting the FPC 60 is plasticized at a temperature of 250° C. or more, the upper surface of the FPC 60 is plasticized when it contacts with the IC 40. In addition, although unevenness is formed in the active surface of the IC 40 due to passivation film, the FPC 60 is changed according to the unevenness. Thereafter, when the FPC 60 is cooled, the thermoplastic resin is cured to adhere the IC 40 to the FPC 60. Thereby, the IC 40 is mechanically connected to the FPC 60 and the active surface of the IC 40 is sealed by the upper surface of the FPC 60 to protect the electrical connection between them. This results in the state shown in FIG. 1.

In the above-mentioned first exemplary embodiment, the through-hole is formed in the FPC, the low melting point metal fills in the through-hole, and the bump of the IC and the low melting point metal are alloyed and bonded. In this case, since it is not necessary for the bump to pass through the FPC, the insulating material to form the FPC is not adhered to the front end of the bump. Accordingly, the electrical connection between the IC and the FPC can be reliably ensured. In addition, since the electrical connection between the IC and the FPC can be accomplished so simply, the manufacturing process thereof can be simplified. Further, the bump can be formed by material other than the solder and the height of the bump can be reduced. As a result, the electrodes can have the narrow pitch between them. For example, using Cu to form the bump enables a narrow clearance of about 10 μm. In addition, it is possible to alloy and bond the bump and the low melting point metal at a relatively low temperature. Accordingly, the damage to the IC due to heating can be reduced.

In addition, in the first exemplary embodiment, the bump is inserted into the through-hole, the bump and the low melting point metal are alloyed and bonded, and the active surface of the IC is sealed by the surface of the FPC. Thereby, the electrical connection and the mechanical connection between the IC and the FPC can be efficiently performed in one process. In addition, since the electrical connection between the IC and the FPC can be protected without using anisotropic conductive film, any shorts generated between the electrodes due to the narrow clearances of the electrodes can be prevented. In addition, since the electrical connection between the IC and the FPC can be protected without filling underfill, the manufacturing cost thereof can be reduced. In addition, since the FPC is composed of thermoplastic resin that is cheaper than thermosetting resin, the manufacturing cost can be reduced.

In addition, instead of the active surface of the IC 40 being sealed by the upper surface of the FPC 60, the active surface of the IC 40 may be sealed by arranging the thermosetting resin between the IC and the FPC so that the electrical connection between them may be protected. In order to seal the active surface of the IC 40 by thermosetting resin, non-cured thermosetting resin film is mounted on the upper surface of the FPC 60 or the active surface of the IC 40 and the IC 40 is pressed on the FPC 60 together with the heating used to cure the thermosetting resin. In addition, as mentioned above, after the IC 40 is electrically connected to the FPC 60, the underfill of thermosetting resin paste fills in the gap between the IC 40 and the FPC 60 and is heated to cure the thermosetting resin. In addition, as mentioned above, since the IC 40 is electrically connected to the FPC 60, it is not necessary that the conductive particles be dispersed in thermosetting resin. Accordingly, in this case, any shorts generated between the electrodes due to the narrow clearances of the electrodes can be reduced or prevented.

Second Exemplary Embodiment

Figure 5:
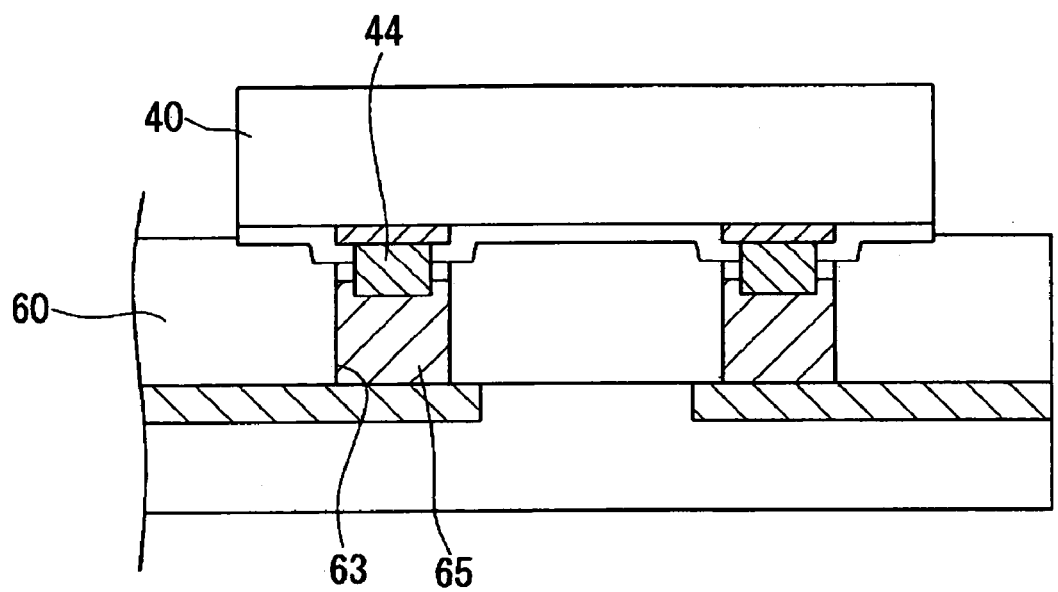
FIG. 5 is a schematic that illustrates a structure to mount an electronic component according to a second exemplary embodiment.

Next, the structure and method of mounting the electronic component according to the second exemplary embodiment is described using FIG. 5. The second exemplary embodiment is different from the first exemplary embodiment in that the conductive thermosetting resin 65 fills in the through-hole 63 of the FPC 60. In addition, the detailed description about the same portion as that of the first exemplary embodiment is omitted.

In the structure to mount the electronic component according to the second exemplary embodiment, the conductive thermosetting resin 65 fills in the through-hole 63 of the FPC 60. As the thermosetting resin 65 has conductivity, the thermosetting resin 65 containing metal powder is used. It is preferable that epoxy resin be used as the thermosetting resin. In addition, it is preferable that fine particle, such as silver (Ag), gold (Au) or nickel (Ni), be used as metal powder. The thermosetting resin 65 has conductivity by dispersing the metal powder to the thermosetting resin.

In the method of mounting the electronic component according to the second exemplary embodiment, first, similar to the first exemplary embodiment, the through-hole 63 is formed in the FPC 60 (See FIG. 4a). Next, non-cured thermosetting resin 65 containing metal powder fills in the through-hole 63 (See FIG. 4b). The non-cured thermosetting resin 65 has a paste shape and the filling process can be performed by a dispense method or printing method. In addition, the thermosetting resin 65 fills in such a way that the front end of the thermosetting resin 65 is positioned in the FPC 60 with a predetermined gap from the upper surface of the FPC 60. Herein, the predetermined gap is slightly less than the height from the active surface of the IC 40 to the front end of the bump 40.

Next, as shown in FIG. 5, the heated IC 40 is positioned on the upper portion of the FPC 60 and the front end of the bump 44 in the IC 40 is inserted into the through-hole 63 in the FPC 60. Further, the front end of the bump 44 is buried in the front end of the thermosetting resin 65. Herein, since the front end of the thermosetting resin 65 is positioned with the predetermined gap from the upper surface of the FPC 60, the front end of the bump 44 is buried in the front end of the thermosetting resin 65 before the active surface of the IC 40 contacts the upper surface of the FPC 60. In addition, as mentioned below, since the bump 44 is adhered to the thermosetting resin 65, the electrical connection between the IC 40 and the FPC 60 can be reliably ensured.

In addition, the above-mentioned heating of IC 40 is performed such that the thermosetting resin 65 to bury the bump 44 is heated to a temperature of about 250° C. In addition to the heating process of the IC 40, the thermosetting resin 65 may be heated by another method. The thermosetting resin 65 composed of epoxy resin is cured by heating it to a temperature of about 250° C. for about 10 seconds. Thereby, the bump 44 buried in the upper end of the thermosetting resin 65 is adhered to the thermosetting resin 65.

In addition, after the frond end of the bump 44 is buried in the front end of the thermosetting resin 65, the active surface of the IC 40 contacts the surface of the FPC 60. Since the IC 40 is heated, the upper surface of the FPC 60 is heated to 250° C. similar to the thermosetting resin 65. Thereby, the upper surface of the FPC 60 is plasticized when it contacts the IC 40. Thereafter, if the FPC 60 is cooled, the thermoplastic resin is cured and adheres the IC 40 to the FPC 60. Thereby, the IC 40 is mechanically connected to the FPC 60 and the active surface of the IC 40 is sealed by the upper surface of the FPC 60 protecting the electrical connection between them. This results in the state shown in FIG. 5.

In the above-mentioned second exemplary embodiment, the through-hole is formed in the FPC, the non-cured thermosetting resin fills in the through-hole, and the bump of the IC is buried in the thermosetting resin. The thermosetting resin is heated and cured, and the bump is adhered to the thermosetting resin. In this case, similar to the first exemplary embodiment, the electrical connection between the IC and the FPC can be reliably ensured. In addition, the manufacturing process can be simplified. Further, the narrow clearance of the electrodes can be accomplished. In addition, it is possible to adhere the bump at a relatively low temperature by heating and curing the non-cured thermosetting resin. Accordingly, the damage to the IC due to the heating can be reduced.

In addition, in the second exemplary embodiment, the bump is inserted into the through-hole, the bump is adhered to the thermosetting resin, and the active surface of the IC is sealed by the surface of the FPC. Thereby, similarly to the first exemplary embodiment, the electrical connection and the mechanical connection between the IC and the FPC can be efficiently performed in one process. In addition, any shorts generated between the electrodes due to the narrow clearances of the electrodes can be reduced or prevented. Accordingly, the manufacturing cost thereof can be reduced.

Exemplary Electronic Apparatus

Figure 6:
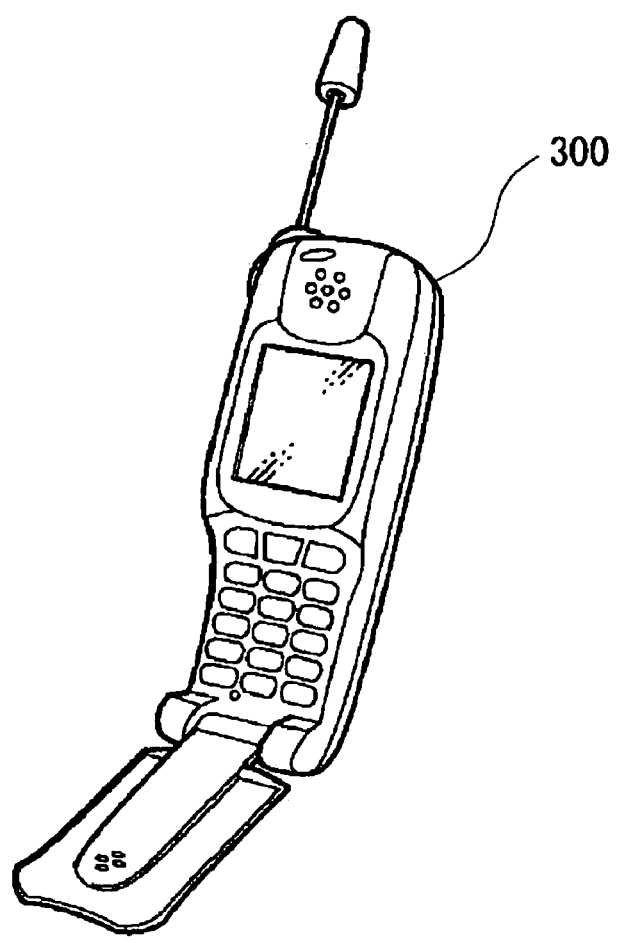
FIG. 6 is a perspective view of a mobile telephone.
Figure 7A:
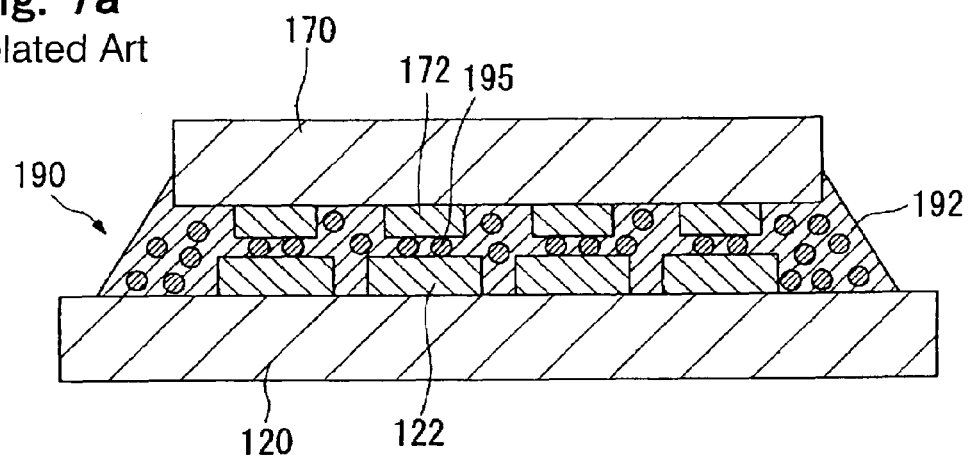
FIGS. 7a and 7b are schematics that illustrate a structure to mount an electronic component according to the related art.
Figure 7B:
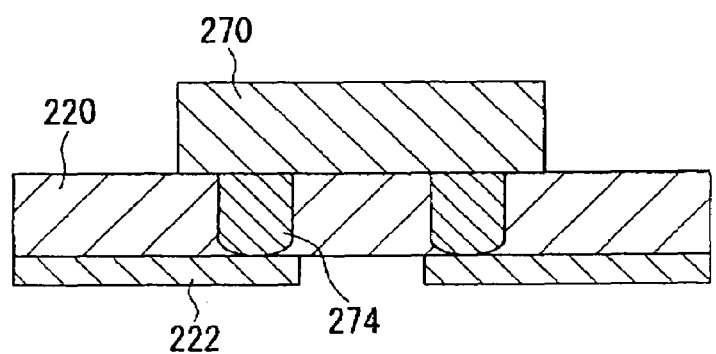

Next, an example of the electronic apparatus including the above-mentioned electronic component module is explained using FIG. 6. FIG. 6 is a perspective view of a mobile telephone. The above-mentioned electronic component module is positioned in the case of a mobile telephone 300.

In addition, the above-mentioned electronic component module can be applied to various electronic apparatuses other than a mobile telephone. For example, it can be applied to the electronic apparatuses such as a liquid crystal projector, a personal computer (PC) for multimedia, an engineering workstation (EWS), a pager, a word processor, a television, a view finder type or monitor direct video tape recorder, an electronic note, an electronic desktop calculator, a car navigation device, a POS terminal, or a device including a touch panel, for example.

In addition, the technical range of the present invention is not limited to the above-mentioned exemplary embodiments, various changes are made to the above-mentioned exemplary embodiments, without departing from the spirit and scope of the present invention. That is, concrete material or layer composition mentioned in the embodiments is only an example, and the change thereof can be appropriately made.

What is claimed is:

1. A method of mounting an electronic component on a substrate, the substrate defining holes that extend through the substrate from a conductor formed on one surface of the substrate to another surface of the substrate, the method comprising:
    filling the holes with a low melting point metal so as to be electrically connected to the conductor;
    alloying and bonding bumps and the low melting point metal by heating the low melting point metal while pressing the bumps formed on the electronic component from the other surface of the substrate with respect to the holes filled with the low melting point metal; and
    heating and plasticizing the substrate indirectly by directly heating the electronic component at a temperature of 250 to 300° C. while pressing an active surface of the electronic component having the bumps formed thereon to the surface of the electronic component being sealed by the other surface of the substrate.

2. The method of mounting an electronic component according to claim 1, further including:
    forming a plurality of the holes filled with the low melting point metal in the substrate with a predetermined gap therebetween,
    the bumps and the low melting point metal being alloyed and bonded by heating the electronic component to heat the low melting point metal while inserting the bumps into the holes from the other surface of the substrate by pressing the bumps.

3. The method of mounting an electronic component according to claim 1,
    the bumps being composed of copper, and the low melting point metal forming a Cu—Sn alloy in the bumps and the low melting point metal junction, in Sn or Sn alloy.

* * * * *